United States Patent [19]

Magarshack et al.

[11] Patent Number: 4,631,492
[45] Date of Patent: Dec. 23, 1986

[54] ULTRA HIGH FREQUENCY POWER AMPLIFIER

[75] Inventors: John Magarshack, Rueil Malmaison; Dimitri Pavlidis, Paris, both of France

[73] Assignee: Thomson-CSF, Paris, France

[21] Appl. No.: 604,036

[22] Filed: Apr. 26, 1984

[30] Foreign Application Priority Data

Apr. 29, 1983 [FR] France .................................. 8307179

[51] Int. Cl.[4] ............................................. H03F 3/68
[52] U.S. Cl. .................................... 330/277; 330/286; 330/295; 330/307
[58] Field of Search ................. 330/53, 56, 57, 124 R, 330/277, 286, 295, 307; 307/299 B, 304; 333/100, 136, 137

[56] References Cited

U.S. PATENT DOCUMENTS 3,652,947 3/1972 Hollingsworth ................ 330/295 X
4,141,023 2/1979 Yamada .......................... 307/304 X

OTHER PUBLICATIONS

Pavlidis et al, "A New, Specifically Monolithic Approach to Microwave Power Amplifiers", *IEEE 1983 Microwave and Millimeter-Wave Monolithic Circuits Symposium*, Digest of Papers, May 31–Jun. 1, 1983, pp. 54–58.
Pengelly, et al, "A Comparison Between Actively and Passively Matched S-Band GaAs Monolithic Fet Amplifiers", *Conferences:* 1981 *IEEE MTT-S International Microwave Symposium Digest*, Los Angeles, CA, U.S.A., 15–19 Jun. 1981, pp. 367–369.
RCA Review, vol. 41, No. 3 (Sep. 1980), B. Dornan et al., "A 4-Ghz GaAs FET Power Amplifier: An Advanced Transmitter for Satellite Down-Link Communication Systems," pp. 472–503.
Electronique Industrielle, No. 45 (Jan. 1983), J. Josefowicz, "Amplificateur de Grande Puissance a l'Etat Solide 3 GHz," pp. 49–50.
IEEE Transactions on Microwave Theory & Techniques, vol. MTT-29, No. 6 (Jun. 1981), R. A. Pucel, "Design Considerations for Monolithic Microwave Circuits," pp. 513–534.
L'Onde Electrique, vol. 61, No. 11 (Nov. 1981), H. F. Cooke, "Les Transistors a Effet de Champ Micro-Ondes," pp. 17–23.

*Primary Examiner*—James B. Mullins
*Attorney, Agent, or Firm*—Oblon, Fisher, Spivak, McClelland, & Maier

[57] ABSTRACT

The invention provides a high gain ultra high frequency amplifier with high output power and low phase shift. This amplifier, whose organization is arborescent, comprises a plurality of series amplification stages (1st to 5th), each stage comprising a plurality of elementary cells. Each cell has only one input but at least two outputs. A cell is, for example, a field effect transistor, with input at the gate and outputs at two drains. The input of the first transistor forms the input of the amplifier. A metalization which joins together all the outputs of the transistors of the last stage forms the output of the amplifier. The transistors are input and output matched by means of microstrip lines, capacities and inductances. The monolithic implantation of this amplifier may, among other things, be provided concentrically about the input transistor or linearly with the transistors of the last stage on one line and those of all the other stages on another line.

10 Claims, 7 Drawing Figures

ULTRA HIGH FREQUENCY POWER AMPLIFIER

BACKGROUND OF THE INVENTION

1. Field of the Invention

The present invention relates to a new structure for monolithic high frequency power amplifiers, with field effect transistors, formed from high speed materials of the family III.V, such for example as GaAs, GaAlAs, InP . . . These integrated amplifiers are matched at the input and at the output and have a high gain and a high output power.

2. Description of the Prior Art

The high frequency amplifier of the invention exists in a plurality of embodiments, with different geometries, which all have the same base, the low or medium power ultra high frequency transistor, having a single input, the gate or the source but having at least two outputs, two drains for example. All the embodiments also have the same structure, in which a plurality of elementary field effect transistors are grouped together in an arborescent organisation. Each elementary field effect transistor may be matched to the same input and output impedance; since it is of low power, it has small geometrical dimension which allows on the one hand a small gate width and on the other hand only a small phase shift between the input and output signals.

Thus each field effect transistor forms the basic module, with one input and at least two outputs, of each stage of the high frequency amplifier. The basic modules are organized in an arborescent structure, that is to say that a transistor of one stage drives at least two transistors of the following stage. All of the outputs of the transistors of the last stage are joined together so as to collect the whole power of the amplifier at a single output. Besides improving the above mentioned electric characteristics, that is to say high operating frequencies and small phase shifts, this structure provides a better input-output insulation, even with a high gain amplifier, and facilitates the geometrical inplantation, which is advantageous for insertion in a more complex integrated circuit, and which permits optimization of the heat dissipation of the amplifier.

SUMMARY OF THE INVENTION

More precisely, the invention relates to the structure of a high frequency power amplifier comprising one input terminal to which a low level input signal is applied and an output terminal at which a high power signal is collected, said structure, arborescent in form, comprising a plurality of amplification stages, connected in series, each stage comprising a plurality of elementary cells, each cell having one input terminal and at least two output terminals, so that a cell on a first stage drives at least two cells of the following amplification stage, the outputs of the cells of the last stage being connected to a single output terminal.

BRIEF DESCRIPTION OF THE DRAWINGS

The invention will be better understood from the description of two embodiments which comply with the structure of the amplifier of the invention, these descriptions referring to the accompanying Figures which show.

DESCRIPTION OF THE PREFERRED EMBODIMENTS

Ultra high frequency power amplifiers, frequently used in telecommunications or for applications of a military type, often use field effect transistors as active elements. Among other qualities required of these amplifiers, three specifications are currently necessary:
input and output inpedance matching
a high voltage or signal gain,
a high output power.

The embodiments which are at the present time the most currently used in solid electronics are constructed in accordance with the hybrid technology but they are limited for several reasons.

The impendances of field effect transistors are not easy to match when the amplifier is operating in a high frequency range, such for example as 5 to 40 GHz. It is known that the connecting lines present, at these impedances, self inductances and capacities which occur because of the proximity between a line and a mass or because of the proximity of two lines to each other, or else because of the shape adopted for a connecting line. These difficulties do not exist at lower frequencies, that is to say those which are reckoned in megahertz at most.

The gain of an ultra high frequency amplifier is limited. To increase the intrinsic gain of a field effect transistor which forms one of the active elements of an ultra high frequency amplifier, the width of the gate of this transistor must be increased: the impedance of the transistor decreases, so it becomes more difficult to match and furthermore the increase in the width of the gate causes a decrease in the maximum operating frequency of the transistor.

The power of a hybrid amplifier is limited. To increase the power of such an amplifier the gate width of each transistor forming this amplifier must be increased, so the same problems of matching the hybrid amplifier appear again. In addition, the intrinsic power of an amplifier is limited by the heat dissipation and by the possible electric breakdown of each transistor if it is driven at its maximum conditions.

Figure 1:
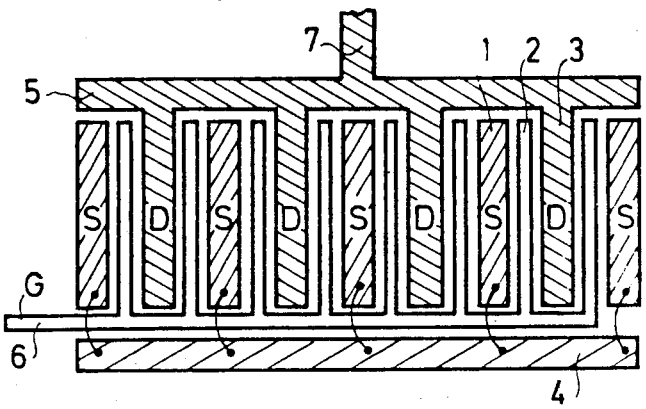
FIG. 1: a diagram of an interdigitated power field effect transistor of the prior art.
Figure 2:
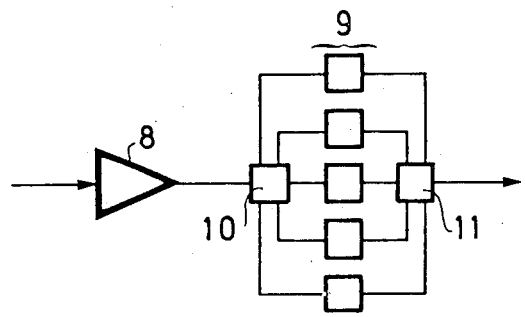
FIG. 2: a diagram of a cellular field effect transistor amplifier of the prior art.

FIGS. 1 and 2 show two known solutions to this ultra high frequency power amplifier problem: they may be implemented either according to a hybrid technology, or an integrated circuit technology.

FIG. 1 shows the general diagram of a so called interdigitated power transistor. This power transistor is obtained by the repetition a large number of times of an elementary field effect transistor, of the level of a signal transistor, formed from a source 1, a gate 2 and a drain 3. Interdigitated transistors are known in which more than 500 elementary transistors such as the one formed by the source 1, gate 2 and drain 3, are grouped together. Coupling of these elementary signal transistors so as to obtain a power transistor may be achieved either as is shown for the sources as in FIG. 1 by connections, by means of wires, between each metalized source region 1 and a metalized region 4 disposed along the interdigitated transistor. It may also be achieved as is also shown for drains 3 by extending, at the level of each signal transistor, the drain metalization, all the metalizations 3 being joined together into a single metalization 5.

Whatever the type of connection provided between the elementary transistor elements, and whatever the nature of these transistors or the geometry adopted for the interdigitated transistor, what is important in this FIG. 1 is not the exact representation of an interdigitated transistor but rather to set forth the problem of the geometry of interdigitated field effect transistors. If such an interdigitated transistor is of large dimension, because it groups together a large number of elementary that is to say signal field effect transistors, in other words if its geometry is too wide because the dimension of the metalizations of sources 1, drain 3 and the connecting strips 4 and 5 are too large at high frequencies with respect to the wave length of the signal amplifier by this transistor, there is phase shifting between the input signal and the output signal. In other words if a signal having a proper frequency of a few GHz, is applied to the gate 6 of such an interdigitated transistor and is collected from the output metalizations 7 of the common drain of this transistor, the path over which the signal travels between the input terminal and the output terminal of the transistor is not unimportant: the path length is appreciably different, on the scale of the wave length of the signal, according as to whether this latter is transmitted by the transistors close to the input and output metalizations or is transmitted by transistors remote from said metalizations. Consequently, the length and the width of each element considered, whether it is the source or the drain of an elementary transistor, or whether it is the length and the width of the interdigitated transistor, intervene and create a series of phase shifts, each elementary transistor forming the interdigitated transistor having its own phase shift.

FIG. 2 shows another type of known ultra high frequency power amplifier. It is a so called "cellular" amplifier.

The ultra high frequency input signal, is applied, in a cellular amplifier, to a first amplification member 8 which is for example a voltage amplifier. The output signal of this amplifier 8, which does not need to be given in detail in the present case, is fed to an output transistor which is cut up into matched cells 9. All the cells 9 are parallel mounted and each of them has only a single input and single output: it may be said that each cell 9 forms a medium power ultra high frequency transistor, combining optimization between the electric characteristics of the ultra high frequency signal transistors and the power which it is possible to deliver without distortion or phase shifting. So that the output signal of amplifier 8 is distributed between the different cells 9, a cellular amplifier comprises dividing and combining passive circuits shown by blocks 10 and 11, the passive circuit 10 distributing the signal between the cells whereas the passive circuit 11 combines the signal and the power coming from cells 9.

Other types of amplifiers could be further mentioned but it should be noted that in the known cases the power gain is generally provided by a single stage: in the case of an interdigitated transistor such as shown in FIG. 1, all the elementary transistors are parallel connected and they have a common input and output. In the case of Figure 2, all the cells are in parallel, they also have an input and an output which are common.

Figure 3:
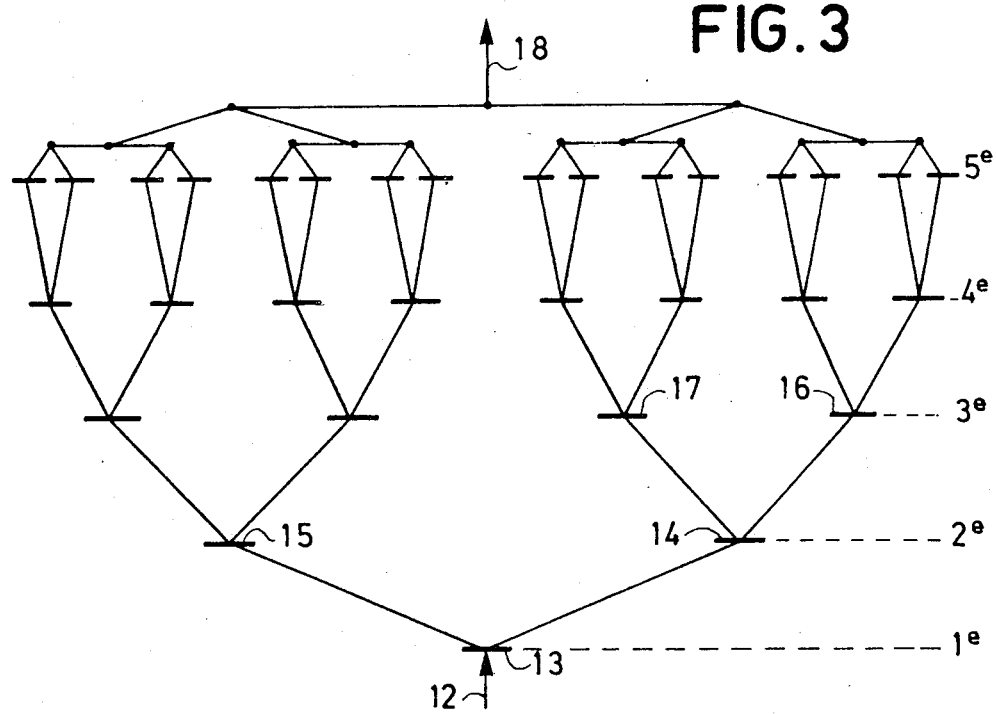
FIG. 3: a structural diagram of an ultra high frequency power amplifier in accordance with the invention.

FIG. 3 shows the structural diagram of an ultra high frequency amplifier in accordance with the invention.

So as to bring out more readily the structure of this amplifier, it will be assumed that each basic element or cell of the amplifier, shown by a line having one input and two outputs, forms a field effect transistor: this representation makes it very much easier to understand the diagram of FIG. 3. The number of stages shown is not limitative of the invention. The ultra high frequency power amplifier shown in FIG. 3 has 5 stages. The input signal, applied to terminal 12 which is for example the gate of the first transistor 13, is amplified and delivered by two output terminals of transistor 13: these two output terminals are for example two drains of this transistor. The signal, slightly amplified in voltage and power, at the two outputs of the first transistor 13 is fed in parallel to the two input terminals of the transistors 14 and 15 which form the second stage of the amplifier according to the invention, in series with the first stage.

The two transistors 14 and 15 of the second stage may be comparable to the transistor 13 of the first stage, that is to say that they are signal transistors each having one input, one gate and two outputs or two drains for example. The voltage and power amplifier signals from transistor 14 are in their turn, and each respectively, fed to the transistors 16 and 17 forming half of the third stage. And symmetrically for the signals from transistor 15.

The structure of the ultra high frequency power amplifier of the invention comprises then a plurality of amplification stages, which are referenced at the side of the Figure as first, second, third...etc stages, which are in series. But in each stage, the basic cells, having a single input and two outputs, are driven by a cell of the preceding stage and drive at least two cells of the following stage. Since the active components for the ultra high frequency amplifiers, at the frequencies considered in GHz, are essentially field effect transistors, each basic cell of the amplifier has a gate as input and two drains or two sources as output.

The outputs of all the transistors at the last stage of the amplifier are grouped together so as to deliver at the output terminal 18 a voltage and power amplified signal.

The structure of the amplifier of the invention recalls the phenomenom of a photo multiplier, in which each incident photon gives rise to at least a pair of photons which in their turn give rise to other pairs of photons.

Besides the characteristic of each cell having one input and at least two identical outputs, each cell is matched to the same impedance at the input and at each output. The connections between the transistors of each stage are provided by matched lines such for example as micro strips whose length and width are related to the working frequency, which mircro strip lines are themselves connected to the gates of the transistors by adequate capacities.

The input of the single transistor of the first stage forms the input of the amplifier. The outputs of the transistors of the last stage, i.e. the fifth stage in FIG. 3, are connected together by conventional passive combiner circuits such as Wilkinson circuits, for delivering a single signal.

Figure 4:
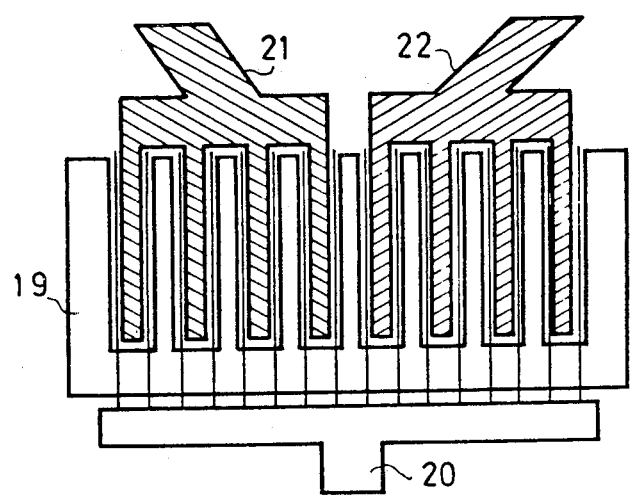
FIG. 4: a simplified diagram of a field effect transistor forming an elementary module of a structure of the invention.

FIG. 4 shows one possible structure among others for a field effect transistor forming each of the basic cells 13, 14, 15 etc of FIG. 3.

This basic cell is formed by an interdigitated field effect transistor having for example a source 19, a gate 20 and two drains 21 and 22.

The fact that the transistor is interdigitated permits a gain in power at each stage but it is important to note that the interdigitated transistors used in the invention only group together a small number of elementary transistors. Thus, in FIG. 4, it can be seen that each output drain corresponds to four signal transistor drains whereas, as was mentioned in connection with FIG. 1, power interdigitated transistors group together up to more than 500 transistors. The difference is important for, since the transistor of FIG. 4 forming an elementary cell of the amplifier of the invention only groups together a small number of signal transistors, it is of a small size: the small size means that there is no phase shift due to geometrical lengths when a signal passes through this transistor.

The elementary cell of FIG. 4 also comprises two input and output matching circuits which have not been shown in this Figure. Finally, the fact of having two separate drains such as shown in FIG. 4 is not indispensable within the scope of the invention: an interdigitated transistor could be designed which would only have two signal transistors or the drains may not be immediately joined together by a metalization 21 and 22 but each comprise its own impedance matching circuit. The important thing, and that has already been stated, is that each cell has only a single input and comprises at least two outputs.

The circuits for matching between the different stages of the amplifier may be simple quarter of a wave lines, for example going from the output of a transistor of one stage to an input of another transistor of the folowing stage, with a series capacity in the line. They may also be more sophisticated and comprise other elements such as inductances which optimize each cell, the final object being to gain slightly in voltage and in power for each elementary cell so as to obtain at the output of the amplifier a high gain without distortion of the signal and without phase shifting. This objective is reached in particular because, with the multiplication of the number of amplifier stages, a small gain is sufficient for each stage with accordingly a small feed back of the output signal on the input signal and low distortion or phase shifting.

FIG. 3 shows the structural diagram of an amplifier in accordance with the invention. In the embodiment thereof, the ultra high frequency power amplifier may assume other geometrical forms for implanting each of the transistors on a semi conductor material chip.

Figure 5:
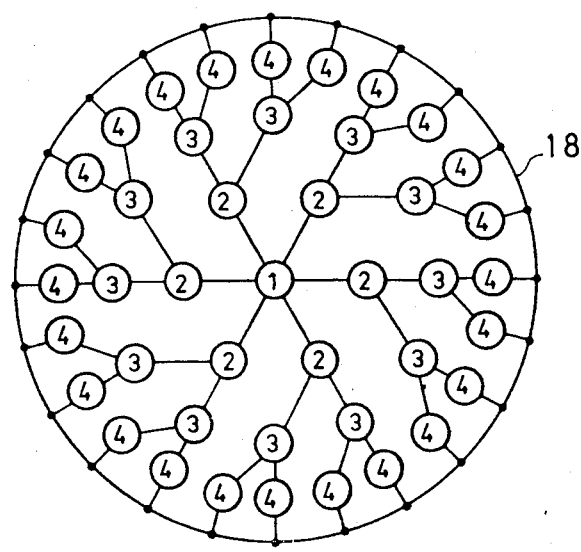
FIG. 5: a first configuration of an ultra high frequency power amplifier in accordance with the invention.

FIG. 5 shows a first embodiment of the amplifier of the invention, this implantation being concentric.

The transistors or elementary cells of each stage in FIG. 5 are not shown, as in FIG. 3 by numbers 13, 14, 15 ... etc but by the number of the stage of the amplifier of which they form part. Thus, the input of the amplifier is provided by the central transistor which forms the first stage and which in the case of this Figure has six outputs. The six outputs of the first transistor feed six transistors which form the second stage, each transistor referenced 2 having in its turn two outputs which each feed a transistor of the third stage and so on. In the configuration of FIG. 5, the amplifier comprises by way of example four stages of elementary transistors.

With this geometrical implantation, the heat dissipation may be regularized and consequently homogenous characteristics maintained for all the transistors, that is to say all the stage of the amplifier.

Figure 6:
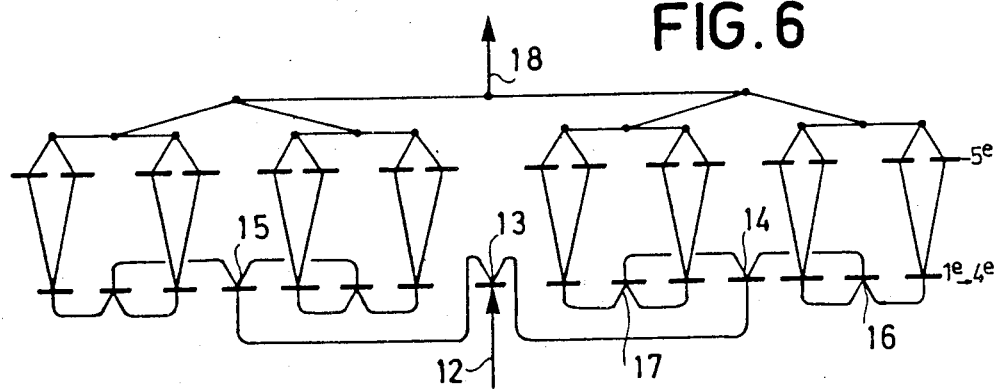
FIG. 6: a second configuration of an ultra high frequency power amplifier in accordance with the invention.

FIG. 6 shows another configuration of an amplifier in accordance with the invention. In this configuration, the transistors are implanted along at least two lines, the first line grouping together the first, second, third and fourth stages, the second line comprising the fifth amplification stage, if it is a question of a five stage amplifier. More generally, an amplifier in accordance with the invention in the configuration of FIG. 6 comprises at least two parallel lines of transistors implanted in the semi-conductor material wafer. In the first line are located the input terminal 12 and the first aligned and alternating stages, the assembly of the first stages being chosen so that the sum of all the transistors is equal to the sum of the transistors of the last stage less one; the last stage, as far as it is concerned, is formed from a single line of transistors whose outputs are connected together so as to form a single output 18 of the amplifier.

With this configuration or geometrical implantation of FIG. 6, the dimensional problems may be resoolved for conventional hybrid amplifiers tend to be very long, particularly if there is a large number of stages.

In this second configuration, since the stages have been divided up into n-1 stages on one line and the last stage on the other line, each line comprising the same number of transistors with the exception of one unit, this configuration allows the heat dissipation to be regularized, which is uniformly distributed.

An important aspect of the ultra high frequency power amplifier of the invention is that the problem of insulation between the input and the output of the electric signal is much less important than in an amplifier of the prior art. In fact, the amplifier of the invention is formed from a plurality of field effect signal transistors each having the same characteristics as its neighbors. The gain of each of these signal transistors may be maintained at a relatively low level so that the signal remains relatively constant—except for the dispersion due to manufacture—between each point of the amplifier or between each basic cell. Since the signal level remains relatively constant and with a low gain for each stage, the feedback of the output signal onto the input signal is small: accordingly, there is little phase shifting between the output signals and the input signals. It is even possible, with the configuration of FIG. 6, to connect the transistors forming the stages of the amplifier so that the phases are also very close, that is to say that with the transistors implanted alternately head to tail along the same line, the phase advance signals counter react with the phase retarded signals for example.

In so far as the total gain of the amplifier is concerned, each elementary transistor may have only a low gain, but the multiplication of this low gain by the number of stages allows a signal to be obtained at the output of the amplifier considered as a whole which is highly amplified in voltage and power without limitations due to phase shifting.

In conclusion, it may be said that within a conventional amplifier of the prior art, the signal increases at each stage by the gain of the stage and the size of the transistor increases with the hierarchy of the powers. On the other hand, with the structure of the invention, the level of the signal does not increase much at each stage but the number of points where the signal is supplied increases at each stage. The structure of the invention thus provides an overall amplification due to the number of small signal transistors rather than due to the power of a small number of power transistors which cause phase shifting. This advantage is due to the use of signal transistors each having one input and at least two outputs, each signal transistor being optimized for the working frequency.

Figure 7:
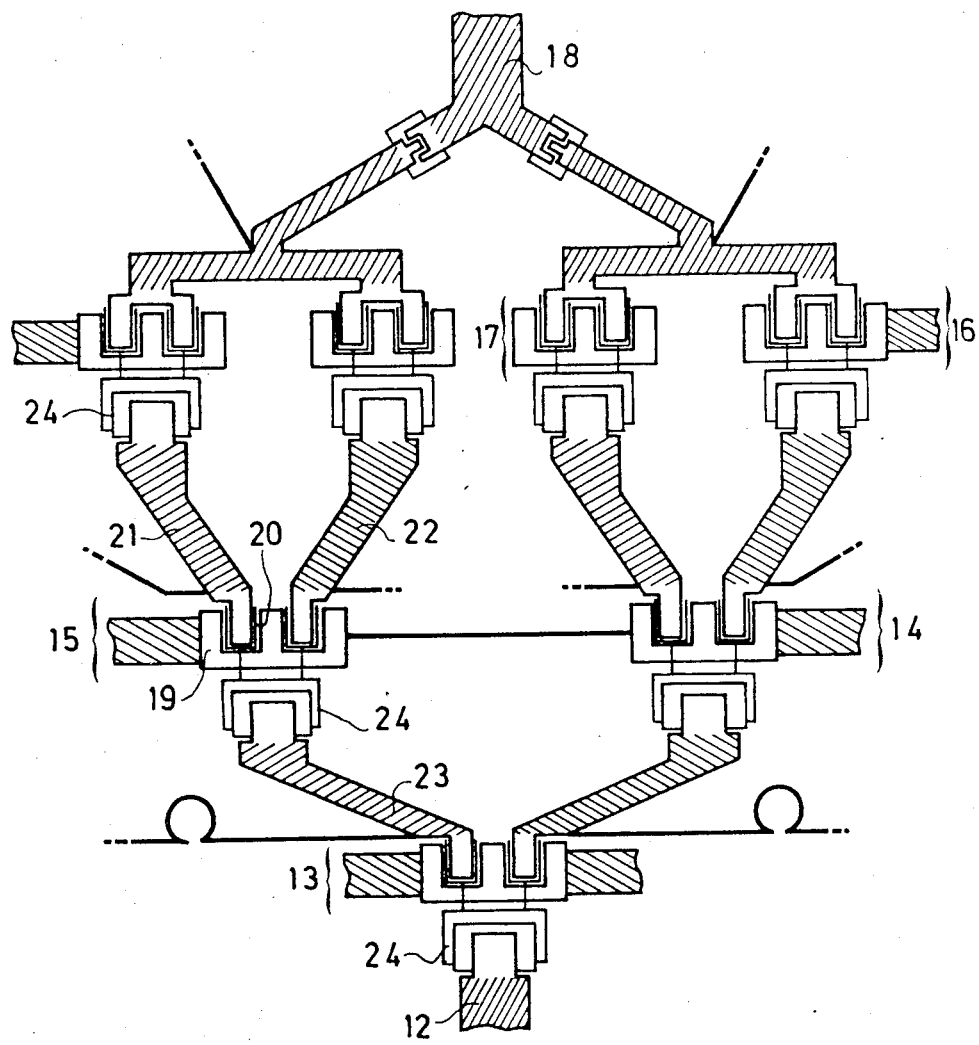
FIG. 7: the implantation of a three stage amplifier on a GaAs substrate in accordance with the invention.

The invention has been described with reference to the Figures in which the field effect transistors have been shown schematically by a line as in FIGS. 3 and 6, or by a circle as in FIG. 5. FIG. 7 shows an amplifier in accordance with the invention, seen at the level of the free surface on a wafer of a semi conductor material. This amplifier is limited in FIG. 7 to three stages only, which does not for all that limit the scope of the invention.

In this representation of the visible part of an amplifier according to the invention, integrated on GaAs, we can recognize:

the first stage, formed by transistor 13,
the second stage, formed by two transistors 14 and 15,
the third stage, whose transistors 16 and 17 form a half.

The input of the amplifier is provided at 12 at the gate of the first transistor 13, and the output at 18, from the drains of all the transistors of the last stage.

Each transistor comprises a source 19, a gate 20 and two drains 21 and 22. The connections between transistors are provided by quarter of a wave micro strips 23 and capacities 24.

The metalizations for the power supply and for decoupling to earth have not been shown in this Figure.

Considering the working frequencies of the amplifier of the invention, high speed materials such as GaAs, AlGaAs, InP or other materials of families III.V for example are preferable. However, this type of amplifier is also applicable to lower frequencies, on materials such as silicon.

The amplifier of the invention is essentially used for radio electric signals, in telecommunications, radar or material and space equipment. It is intended for monolithic integration and a configuration such as the one shown in FIG. 6 allows it to be included in more complex integrated circuits, comprising among other things an ultra high frequency amplifier.

The invention is clearly stated in the following claims.

What is claimed is:

1. An ultra high frequency power amplifier comprising an input terminal to which a low level input signal is applied and an output terminal from which is collected a high power signal, the structure of said amplifier, of arborescent form, comprises a pluraltiy of series connected amplifier stages, the first stage comprising a single transistor and the remaining stages comprising a plurality of elementary transistors, each transistor having one input terminal and at least two output terminals, the transistor of the first stage being directly connected to and directly driving at least two transistors of the following amplification stage, the outputs of the transistors of the last stage being connected to a single output terminal.

2. The ultra high frequency amplifier as claimed in claim 1, wherein said elementary transistors are low power field effect transistors whose input terminal is the gate, whose output terminals are at least two drains, the transistors being biased by their source electrodes.

3. The ultra high frequency amplifier as claimed in claim 2, wherein, with the field effect transistors forming said elementary transistors being low powered transistors, their geometrical dimensions are small and the phase shifting between the input and output signals, for each transistor, is small.

4. The ultra high frequency amplifier as claimed in claim 2, wherein all the transistors of the stages forming the amplifier have the same dimensions and the power gain, between a first stage and a second stage which follows it, is obtained by at least doubling the number of transistors of the second stage with respect to the first stage.

5. The ultra high frequency amplifier as claimed in claim 1, formed on a semi-conductor material crystal according to the integrated circuit technology.

6. The ultra high frequency amplifier as claimed in claim 5, wherein its monolithic implantation structure is concentric, the input transistor forming the first stage being at the center, the transistors of the following stages being implanted along concentric circles about the input transistor, the output signal of the amplifier being connected from a metalization which surrounds the last amplification stage.

7. The ultra high frequency amplifier as claimed in claim 5, whose monolithic implantation structure is linear, the transistors of the first stages being implanted along the first line, distributed symmetrically with respect to the central input transistor, the transistors of the last stage being implanted along a second line, parallel to the first one, the input of the amplifier being on the central transistor of the first line and the output of the amplifier being taken from a metalization which joins together all the ouputs of all the transistors of the second line.

8. The ultra high frequency amplifier as claimed in claim 7, wherein among the transistors of the first stages, the transistors of one stage are implanted head to tail with the transistors of the following stage, so as to cancel out any phase shifts.

9. The ultra high frequency amplifier as claimed in claim 1, wherein, with the transistors forming said elementary transistors being low powered transistors, their geometrical dimensions are small and the phase shifting between the input and output signals, for each transistor, is small.

10. The ultra high frequency amplifier as claimed in claim 1, wherein all the transistors of the stages forming the amplifier have the same dimensions and the power gain, between a first stage and a second stage which follows it, is obtained by at least doubling the number of transistors of the second stage with respect to the first stage.

* * * * *